(12) United States Patent
Tomono et al.

(10) Patent No.: US 8,375,279 B2
(45) Date of Patent: Feb. 12, 2013

(54) RECEIVING DEVICE AND RECEIVING METHOD

(75) Inventors: Mitsuru Tomono, Kawasaki (JP); Naoto Yoneda, Yokohama (JP); Makoto Hamaminato, Kawasaki (JP)

(73) Assignees: Fujitsu Limited, Kawasaki-Shi (JP); Fujitsu Semiconductor Limited, Yokohama-Shi (JP)

( * ) Notice: Subject to any disclaimer, the term of this patent is extended or adjusted under 35 U.S.C. 154(b) by 163 days.

(21) Appl. No.: 12/929,927

(22) Filed: Feb. 24, 2011

(65) Prior Publication Data

US 2011/0239095 A1    Sep. 29, 2011

(51) Int. Cl.
 *H03M 13/03* (2006.01)
(52) U.S. Cl. .................. 714/791; 714/794; 714/777
(58) Field of Classification Search .......... 714/791, 714/794, 792, 780, 786, 777, 758, 755, 752
See application file for complete search history.

(56) References Cited

U.S. PATENT DOCUMENTS

| | | | | |
|---|---|---|---|---|
| 5,014,276 A | * | 5/1991 | Bush et al. | 714/704 |
| 5,502,736 A | * | 3/1996 | Todoroki | 714/795 |
| 5,509,021 A | * | 4/1996 | Todoroki | 714/795 |
| 5,875,199 A | * | 2/1999 | Luthi | 714/780 |
| 7,430,257 B1 | * | 9/2008 | Shattil | 375/347 |

OTHER PUBLICATIONS

Meritxell Lamarca et al., "Iterative Decoding Algorithms for RSConvolutional Concatenated Codes", IEEE International Symposium on Turbo Codes and Related Topics, Brest, France, pp. 543-546, Sep. 2003.
ShinichiMurata, "A Study on Improving Coding Gain of the Error-Correcting Decoder on ISDB-T Receiver by Using an Iterative-Decoding Method", the IEICE General Conference 2008, Feb. 7, 2008.

* cited by examiner

*Primary Examiner* — Fritz Alphonse
(74) *Attorney, Agent, or Firm* — Staas & Halsey LLP

(57) ABSTRACT

To provide a receiving device and a receiving method which achieve iterative decoding regarding concatenated codes containing a convolutional code while suppressing increase in circuit scale, a decoder and an error correcting part iteratively perform decoding and error correction corresponding to a convolutional code on soft-decision inputs corresponding to the received signal sequence. Depending on whether a decoding result matches error corrected decoded data obtained in previous processing or not, penalties are calculated corresponding to branches transiting with the respective decoded results, and a branch metric is calculated by reflecting the calculated penalties as to decrease likelihood ratio of each of the branches to which the penalties are to be added. The obtained branch metric is input to a decoder, thereby reflecting the penalty corresponding to the decoding result.

8 Claims, 13 Drawing Sheets

FIG. 4

| DECODED DATA | AUXILIARY INFORMATION | P0 | P1 |
|---|---|---|---|
| 0 | SUCCESS | 1 | $W \times a$ |
| 1 | SUCCESS | $W \times a$ | 1 |
| 0 | FAILURE | $(W \times a)/2$ | $(W \times a)/2 + 1$ |
| 1 | FAILURE | $(W \times a)/2 + 1$ | $(W \times a)/2$ |

RECEIVING DEVICE AND RECEIVING METHOD

CROSS-REFERENCE TO RELATED APPLICATION

This application is based upon and claims the benefit of priority from Japanese Patent Application No. 2010-072308, filed on Mar. 26, 2010, the entire contents of which are incorporated herein by reference.

FIELD

The present invention relates to a receiving device and a receiving method for performing error correct decoding on a received signal in response to reception of an error correcting code generated by tandem concatenated coding using a convolutional code as inner code.

BACKGROUND

As error correction coding for digital terrestrial broadcasting, there is applied concatenated coding using a Reed-Solomon code (RS code) as outer code and a convolutional code as inner code. On the receiving side, error correction combining Viterbi decoding and Reed-Solomon decoding is performed.

There have been proposed iterative decoding methods which improve error correcting capability by iterating such error correction on the receiving side (see Non-patent Document 1: Meritxell Lamarca et al., "Iterative Decoding Algorithms for RS-Convolutional Concatenated Codes", 2003 and Non-patent Document 2: Shinichi Murata, "An Iterative-Decoding Method for Concatenated Error-Correcting Codes on ISDB-T", the IEICE General Conference 2008).

In the technique disclosed in Non-patent Document 1, a soft output method such as SOVA (Soft Output Viterbi Algorithm) decoding or Max-log-MAP decoding is used for decoding of convolutional codes. Further, the soft output method is also employed for the Reed-Solomon decoding.

On the other hand, in the technique disclosed in Non-patent Document 2, feedback values from Reed-Solomon decoding to decoding of convolutional codes are generated depending on success or failure of error correction, for every TSP (Transport stream packet) which is a processing unit of the Reed-Solomon code.

Now, in the technique of Non-patent Document 1, by using the soft decision method which represents whether a received signal is 1 or 0 with a certain range, information obtained from the received signal is used for error correction. Thus, in the receiving device to which the technique of the Non-patent Document 1 is applied, since the soft output method is applied to both decoding of convolutional codes and Reed-Solomon decoding, the circuit scale becomes large. Accordingly, it is difficult to be applied as it is to ISDB-T (Integrated Services Digital Broadcasting-Terrestrial) which is digital terrestrial broadcasting in Japan.

On the other hand, in the technique of Non-Patent Document 2, circuit structures are simplified in consideration of application to ISDB-T. However, there is no specific description about how to generate likelihood ratio information to be added to or subtracted from metric in the decoding of convolutional codes in order to feed back information on success/failure of error correction decoding to the decoding of convolutional codes.

SUMMARY

A receiving device according to one aspect includes a soft decision generating part generating a sequence of soft-decision inputs represented by a predetermined number of bits from a received signal sequence; a decoder performing decoding process corresponding to a convolutional code on the soft-decision inputs generated corresponding to the received signal sequence; an error correcting part performing error correction on a decoding result sequence obtained by the decoder to generate an error corrected decoded data sequence containing error corrected decoded data corresponding to the received signal sequence; an iteration controlling part causing the decoder and the error correcting part to iteratively perform first error correct decoding on the received signal sequence; a penalty calculating part calculating, based on whether a success of the error correction is indicated or not by auxiliary information obtained from the error correcting part in second error correct decoding performed before the first error correct decoding, respective penalties for a branch transiting with a decoding result which matches the error corrected decoded data obtained in the error correcting part and a branch transiting with a decoding result which does not match the error corrected decoded data; and a penalty reflecting part calculating a branch metric by reflecting the penalties on a basic value, which is equivalent to a distance between each received signal contained in the received signal sequence and a coder output in a state transition model to which a coder corresponding to the decoder complies, so as to decrease likelihood ratio of each of the branches, and inputting the branch metric being calculated to the decoder as a feedback value from the second error correct decoding.

The receiving method according to one aspect includes a decoding procedure using a decoder which performs decoding process corresponding to a convolutional code on a received signal sequence and an error correcting part performing error correction on a decoding result sequence obtained by the decoder to generate an error corrected decoded data sequence containing error corrected decoded data corresponding to the received signal sequence; an iteration controlling procedure causing the decoder and the error correcting part to iteratively perform first error correct decoding on the received signal sequence; a penalty calculating procedure calculating, based on whether a success of the error correction is indicated or not by auxiliary information obtained from the error correcting part in second error correct decoding performed before the first error correct decoding, respective penalties for a branch transiting with a decoding result which matches the error corrected decoded data obtained in the error correcting part and a branch transiting with a decoding result which does not match the error corrected decoded data; and a penalty reflecting procedure calculating a branch metric by reflecting the penalties on a basic value, which is equivalent to a distance between each received signal contained in the received signal sequence and a coder output in a state transition model to which a coder corresponding to the decoder complies, so as to decrease likelihood ratio of each of the branches, and inputting the branch metric being calculated to the decoder as a feedback value from the second error correct decoding.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4 is a table illustrating an example of penalty calculation;

DESCRIPTION OF EMBODIMENTS

Hereinafter, embodiments of a receiving device and a receiving method will be described in detail based on the drawings.
(Embodiment 1)

Figure 1:
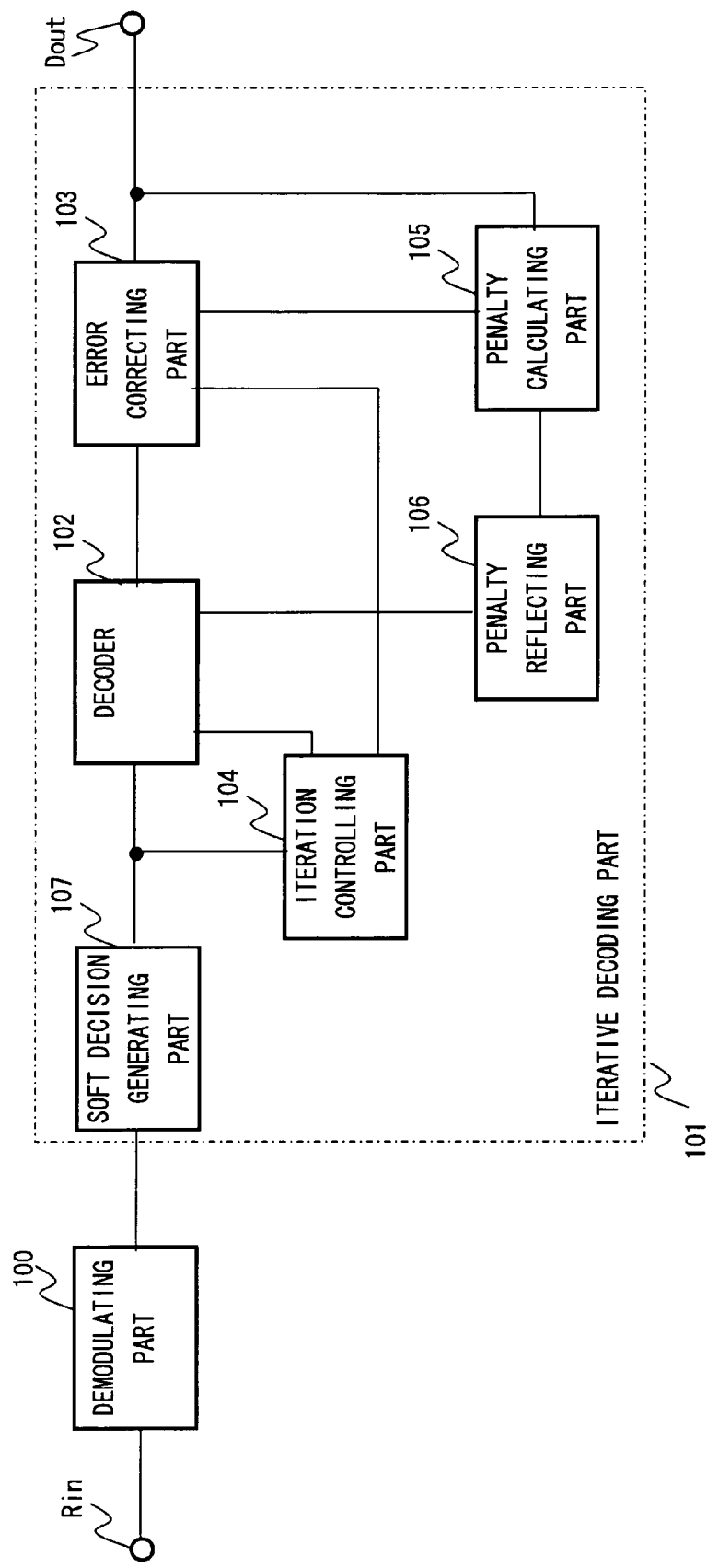
FIG. 1 is a diagram illustrating an embodiment of a receiving device.

FIG. 1 illustrates an embodiment of a receiving device. The receiving device illustrated in FIG. 1 performs decoding corresponding to concatenated codes containing a convolutional code as inner code.

A demodulating part 100 included in the receiving device illustrated in FIG. 1 performs demodulation of an incoming modulating signal which transmits through a terminal denoted Din, and generates received signals representing a code sequence of concatenated codes containing a convolutional code as inner code. On these received signals, the iterative decoding part 101 performs iterative decoding as will be described later.

The iterative decoding part 101 has a decoder 102, an error correcting part 103, an iteration controlling part 104, a penalty calculating part 105, a penalty reflecting part 106, and a soft decision generating part 107. Upon reception of a soft-decision input generated by the soft decision generating part 107, the decoder 102 performs decoding corresponding to the convolutional code. The error correcting part 103 performs error correction on a decoding result obtained in the decoder 102. The iteration controlling part 104 performs control to cause the decoder 102 and the error correcting part 103 to iteratively execute decoding of received signals. The penalty calculating part 105 calculates a penalty indicating suspicion of the received signals based on error corrected decoded data and auxiliary information indicating whether the error correction is succeeded or not, which are obtained as correction results by the error correcting part 103. This penalty is reflected by the penalty reflecting part 106 on decoding corresponding to the convolutional code in iterative decoding by the decoder 103.

The soft decision generating part 107 receives complex coordinates (i, q) indicating the position in a constellation of the signal point corresponding to each symbol of a demodulation signal from the demodulating part 100, and converts the complex coordinates into corresponding soft-decision inputs as will be described below.

Figure 2:
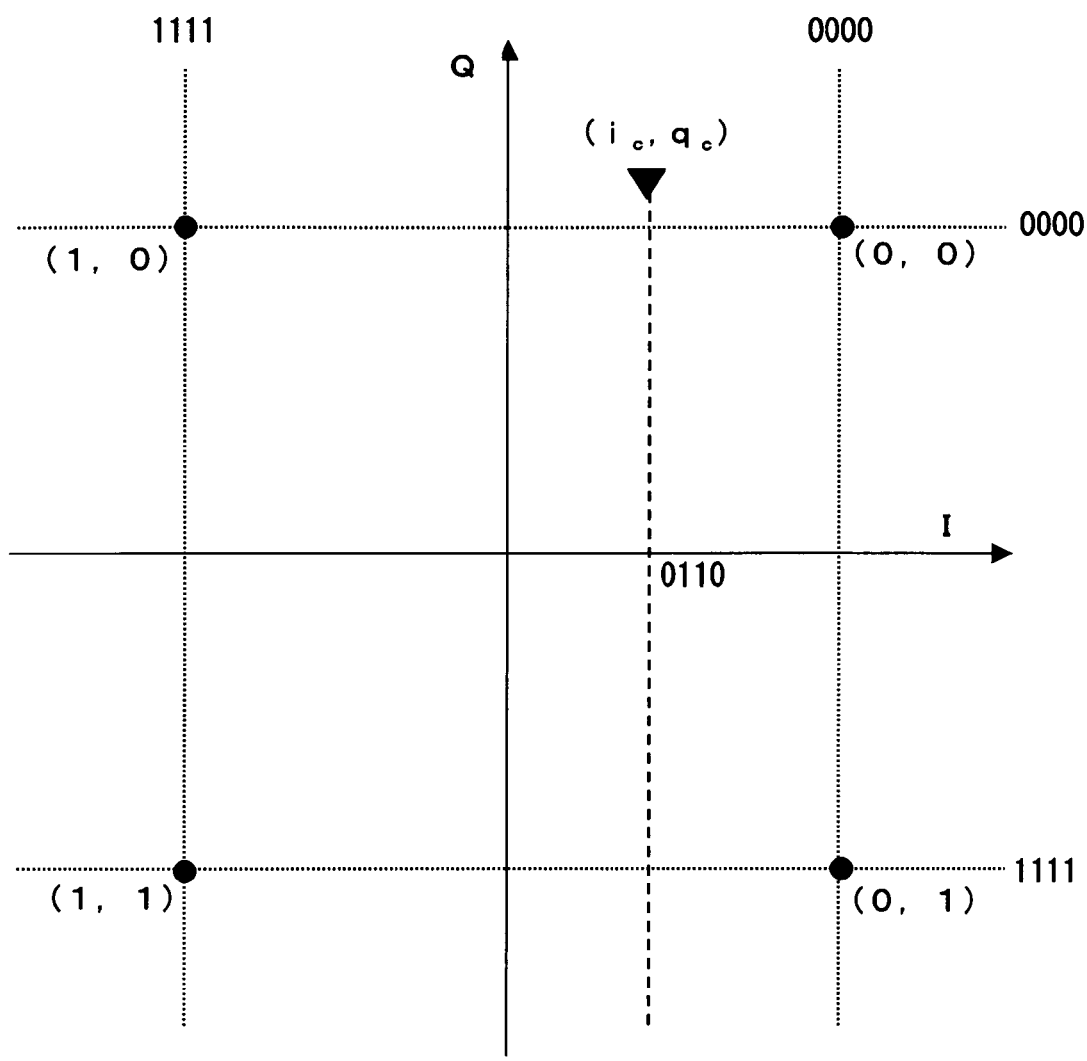
FIG. 2 is a diagram describing soft-decision inputs.

FIG. 2 illustrates a diagram describing soft-decision inputs. The example of FIG. 2 illustrates a constellation when QPSK (Quadratic Phase Shift Keying) is used as a modulating method. Further, in FIG. 2, four constellation points corresponding to two-bit information (b0, b1) in the QPSK modulation are illustrated with black dots and corresponding complex coordinate values.

The soft decision generating part 107 is capable of digitizing, for example, the coordinates of a signal point in units of dividing the inside area of a rectangle with four constellation points illustrated in FIG. 2 being apexes by 16 in a range of real part and a range of imaginary part. In this manner, two soft-decision inputs (Xc, Yc) represented by four-bit digital values can be generated from complex coordinates (ic, qc) of a signal point C. The soft-decision inputs (Xc, Yc) obtained in this manner correspond to two-bit information (b0, b1) in the QPSK modulation.

In addition, when any component of the coordinates of a signal point corresponding to a received signal is out of the range indicated by the above-described rectangle area, this component can be converted into a maximum or minimum soft-decision input corresponding to this component. In the example illustrated in FIG. 2, the I-axis coordinate corresponding to a signal point located on and outside the border of the rectangle area passing a constellation point (0, 0) and a constellation point (0, 1) is converted into a soft-decision input "0000" corresponding to information b0. On the other hand, the I-axis coordinate corresponding to a signal point located on and outside the border of the rectangle area passing a constellation point (1, 0) and a constellation point (1, 1) is converted into a soft-decision input "1111" corresponding to the information b0. Similarly, the Q-axis coordinate corresponding to a signal point located on and outside the border of the rectangle area in the Q-axis direction is converted into soft-decision inputs "0000" and "1111" each corresponding to the information b1.

In the decoder 102, for example, a Viterbi algorithm can be used for decoding the convolutional code. In doing so, the decoder 102 performs processing to compare the above-described soft-decision inputs with coder outputs assumed from a state transition model used for coding, and estimate the most likely sequence of decoded data.

Figure 3:
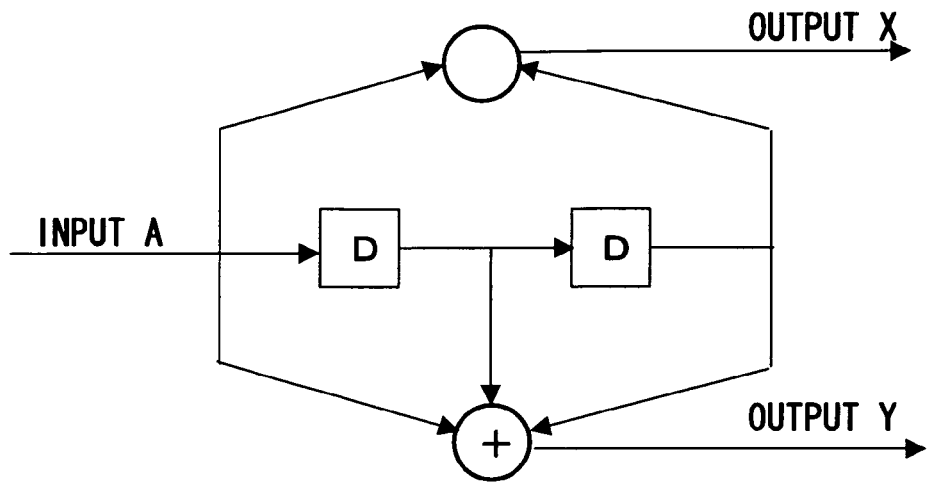
FIGS. 3A and 3B are diagrams describing a convolutional code.
Figure 3:
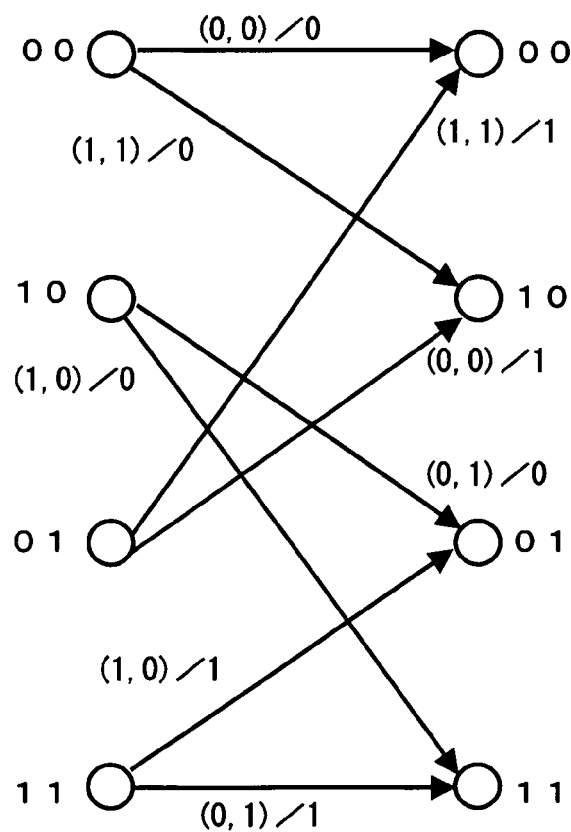

FIGS. 3A and 3B illustrate diagrams describing the convolutional code. FIG. 3A illustrates an example of a convolutional coder with constraint length of 3. Further, FIG. 3B illustrates an example of a trellis diagram representing state transitions of the convolutional coder illustrated in FIG. 3A. In the trellis diagram illustrated in FIG. 3B, state transitions from one to another among four states (00), (10), (01), (11) of the coder are illustrated corresponding to a code combining coder outputs (X, Y) and an input A.

The likelihood of a received signal input to the decoder 102 can be evaluated based on, for example, a distance between constellation points corresponding to outputs X, Y of the convolutional coder and received signal points. In doing so, the decoder 102 obtains the branch metric corresponding to the above-described distance for each of the state transitions in decoding. The decoder then obtains a sequence of decoding results which gives a minimum path metric based on the branch metric corresponding to a sequence of received signals, and provides the sequence of decoding results to processing of the error correcting part 103.

The error correcting part 103 performs error correction, such as a parity check, on the sequence of decoding results delivered by the decoder 102, so as to generate error corrected decoded data. For example, when a Reed-Solomon code is used as outer code, the error correcting part 103 performs the error correction for every TSP (Transport Stream Packet) which is a processing unit of the Reed-Solomon code. Then, together with the error corrected decoded data in TSP units, auxiliary information indicating whether the error correction of each TSP is succeeded or not is generated.

The penalty calculating part 105 calculates a penalty P0 and a penalty P1 based on a combination of auxiliary information and values of error corrected decoded data. The penalty P0 is calculated to be applied when a Viterbi decoding output corresponding to the state transition is "0". And the penalty P1 is calculated to be applied when a Viterbi decoding output corresponding to the state transition is "1".

FIG. 4 illustrates an example of penalty calculation. In the example of FIG. 4, values of the penalties P0, P1 are presented corresponding to combinations of two types of auxiliary information indicating "success" and "failure" and values "0", "1" of error corrected decoded data.

When the auxiliary information indicates success of the error correction, reliability of the Viterbi decoding output having a value which matches the error corrected decoded data after error correction is high. In contrast, reliability of the Viterbi decoding output having a value which does not match the error corrected decoded data obtained from the succeeded error correction is clearly low. The penalty calculating part 105 calculates the values of the penalties P0, P1 so as to impose a large penalty on a branch giving the Viterbi decoding output which does not match error corrected decoded data obtained from succeeded error correction. On the other hand, when the error correction fails, it is not possible to determine reliability of the Viterbi decoding output by whether or not the value matches the error corrected decoded data after error correction. Accordingly, the penalty calculating part 105 calculates the values of the penalties P0, P1 so as to impose a medium-size penalty irrespective of the result of Viterbi decoding when the error correction fails.

In the example illustrated in FIG. 4, a first penalty represented by the product of a predetermined weight coefficient W and another predetermined coefficient α is calculated corresponding to the Viterbi decoding output which does not match the error corrected decoded data obtained in the succeeded error correction. Here, the value of the above-described coefficient α is, for example, the maximum value corresponding to the binary number which has the same bit length as the above-described soft-decision inputs. On the other hand, regarding the penalties P0, P1 corresponding to the case where the error correction fails, a third penalty having a half value of the above-described first penalty is applied to a branch giving the Viterbi decoding output which matches the error corrected decoded data. A second penalty obtained by adding a numeric value "1" to the above-described third penalty is given to a branch giving the Viterbi decoding output which does not match the error corrected decoded data obtained by the failed error correction. Further, a numeric value "1" is applied as the penalty corresponding to the Viterbi decoding output which matches the error corrected decoded data obtained in the succeeded error correction. Thus, regarding cases which can be classified by whether the error correction is succeeded or not and whether the Viterbi decoding output matches the error corrected decoded data obtained in the error correction or not, the respective cases can be graded based on the degree of suspicion, and the penalties reflecting the grades can be set.

The penalty reflecting part 106 can reflect the pair of penalties P0, P1 from the penalty calculating part 105 corresponding to a combination of auxiliary information and error corrected decoded data on decoding by the decoder 102 in the following manner for example. The penalty reflecting part 106 calculates a branch metric Mb0 which causes the Viterbi decoding output to be "0" and a branch metric Mb1 which causes the Viterbi decoding output to be "1" by formula (1) represented using the received penalties P0, P1.

$$Mb0 = |X - Xc| + |Y - Yc| + P0$$

$$Mb1 = |X - Xc| + |Y - Yc| + P1 \quad (1)$$

Here, in the formula (1), a distance between the constellation points corresponding to the outputs X, Y of the convolutional coder and the received signal points (Xc, Yc) is represented as the sum of absolute differences in corresponding components from each other.

In the branch metrics Mb0, Mb1 calculated in this manner, suspicion of a decoding result estimated from the combination of auxiliary information and error corrected decoded data obtained in previous decoding is reflected. Then the processing to search for paths which cause the minimum path metric is performed by the decoder 102 based on the branch metrics Mb0, Mb1 adjusted by using the previous decoding result. So, a more likely decoding result can be obtained by the decoder 102.

Here, to the above-described penalty calculating part 105, auxiliary information and error corrected decoded data which each has a value "0" or "1" are input. Therefore, it is not necessary to generate a soft-decision input representing an error correction result, and the error correcting part 103 performing hard decision similar to conventional one can be used. Further, the penalties P0, P1 described above can be obtained by a simple arithmetical operation corresponding to the combination of auxiliary information and error corrected decoded data which are obtained in error correcting process. Processing of reflecting the penalties on decoding of convolutional codes can also be achieved by the arithmetical operation as indicated by the formula (1).

Therefore, in the receiving device having the components as illustrated in FIG. 1, iterative decoding of the concatenated codes containing the convolutional code can be achieved while suppressing the increase in circuit scale. Conclusive error corrected decoded data obtained through above-described iterative decoding processing can be transmitted through a terminal denoted Dout. By applying such a receiving device to, for example, a receiving device for digital terrestrial broadcasting, receiving characteristics thereof can be improved.

Next, an example of application to a receiving device of digital terrestrial broadcasting will be described.

(Embodiment 2)

Figure 5:
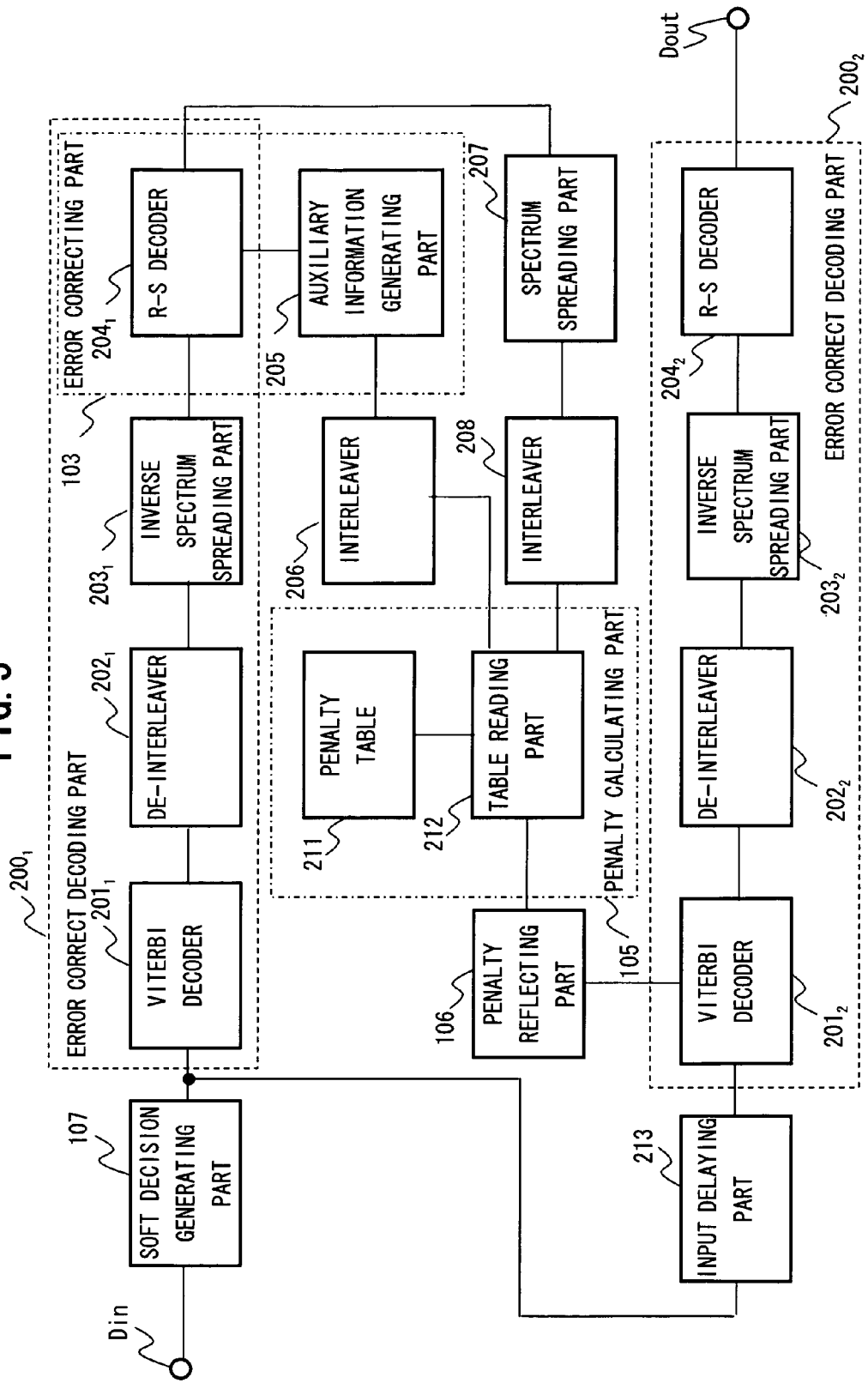
FIG. 5 is a diagram illustrating another embodiment of the receiving device.

FIG. 5 illustrates another embodiment of the receiving device. Note that among components illustrated in FIG. 5, ones equivalent to those illustrated in FIG. 1 are given the same reference numerals, and descriptions thereof are omitted.

The receiving device illustrated in FIG. 5 is for digital terrestrial broadcasting. In the standards of receiving devices for digital terrestrial broadcasting, interleaving and spectrum spreading are applied to the concatenated codes combining the convolutional code and the Reed-Solomon code.

In the example of FIG. 5, two systems of error correct decoding parts $200_1$, $200_2$ are used to achieve iterative decoding of received signals. In the error correct decoding part $200_1$, soft-decision inputs corresponding to the received signals are input from the soft decision generating part 107. Demodulated received signals are delivered to the soft decision generating part 107 through a terminal denoted Din. On the other hand, the soft-decision inputs generated in the soft decision generating part 107 are input to the error correct decoding part $200_2$ via an input delaying part 213.

The error correct decoding parts $200_1$, $200_2$ each have a Viterbi decoder 201, a de-interleaver 202, an inverse spectrum spreading part 203, and a Reed-Solomon decoder (RS decoder) 204. In FIG. 5, respective components belonging to the error correct decoding parts $200_1$, $200_2$ are denoted by reference numerals to which subscripts indicating the corresponding systems are added. Hereinafter, when the components belonging to the error correct decoding parts $200_1$, $200_2$ are not discriminated by the systems to which they belong, the subscripts indicating the systems are omitted.

The Viterbi decoder 201 illustrated in FIG. 5 corresponds to the decoder 102. A decoding output obtained in this Viterbi decoder 201 is delivered to the Reed-Solomon decoder (R-S decoder) 204 via the de-interleaver 202 and the inverse spectrum spreading part 203. The de-interleaver 202 de-interleaves a decoding result by the Viterbi decoder 201, to thereby restore plural TSPs with spread spectra. The inverse spectrum spreading part 203 releases spectrum spreading on the plural TSPs with spread spectra, to thereby restore the R-S code of each TSP. Then, the R-S decoder 204 performs error correction on the restored R-S code of every TSP. Error corrected Decoded data are generated by this error correction.

In the receiving device illustrated in FIG. 5, error corrected decoded data obtained in the R-S decoder $204_1$ of the error correct decoding part $200_1$ are provided to error correct decoding in the error correct decoding part $200_2$ of the next stage via a spectrum spreading part 207 and an interleaver 208.

The auxiliary information generating part 205 illustrated in FIG. 5 generates auxiliary information corresponding to each bit contained in each TSP from syndromes indicating whether error correction in TSP units is succeeded or failed in the R-S decoder $204_1$. For example, the auxiliary information generating part 205 can generate a numerical value "1" as auxiliary information of each bit contained in the TSP on which error correction has been succeeded, and can generate a numerical value "0" as auxiliary information of each bit of the TSP on which error correction has been failed.

Thus, in the embodiment illustrated in FIG. 5, the function of the error correcting part 103 is exemplified by the R-S decoder $204_1$ included in the error correct decoding part $200_1$ of the first stage and the auxiliary information generating part 205.

The auxiliary information corresponding to each TSP obtained in the above-described auxiliary information generating part 205 are transferred the error correct decoding part $200_2$ of the next stage via an interleaver 206 and are used in the error correct decoding. This interleaver 206 performs, on auxiliary information corresponding to each TSP, recombination which is equivalent to interleaving performed by the above-described interleaver 208 on the error corrected decoded data with spread spectra.

Hereinafter, a technique will be described for controlling the Viterbi decoding in the error correct decoding part $200_2$ of the second stage using the error corrected decoded data and the auxiliary information obtained by the error correct decoding part $200_1$ of the first stage.

The penalties P0, P1 calculated by the penalty calculating part 105 can be calculated in advance based on the weight coefficient W determined in advance and the bit length of the soft-decision inputs. In a penalty table 211 illustrated in FIG. 5, penalties P0, P1 calculated in advance are stored corresponding to combinations of "0" or "1" for auxiliary information and "0" or "1" for error corrected decoded data. According to auxiliary information and decoded data received from the interleavers 206, 208, a table reading part 212 reads the corresponding penalties P0, P1 from this penalty table 211. That is, in the embodiment illustrated in FIG. 5, the function of the penalty calculating part 105 is exemplified by the penalty table 211 and the table reading part 212.

Further, whenever the soft-decision inputs corresponding to each signal point are input from an input delaying part 213 to the Viterbi decoder $201_2$, the penalties P0, P1 read by the table reading part 212 are delivered to the penalty reflecting part 106. The penalty reflecting part 106 then adds the penalties P0, P1 to the branch metrics of branches for which outputs of the Viterbi decoder $201_2$ are "0", "1", respectively.

Thus, in the receiving device illustrated in FIG. 5, the error corrected decoding result obtained by the error correct decoding part $200_1$ of the previous stage is reflected by imposing a large penalty on a branch which gives a decoding result having a high possibility of error in Viterbi decoding in the error correct decoding part $200_2$ of the second stage.

In addition, it is possible to achieve the penalty table 211, the table reading part 212, and the penalty reflecting part 106 with a memory element having a small capacity and a small-scale logical operation circuit. Therefore, improvement in characteristics by iterative decoding can be achieved within the range of constraints of a circuit scale required in the receiving device for digital terrestrial broadcasting. Further, it is also possible to form a receiving device including three or more stages of error correct decoding parts.

Moreover, the functions of the respective parts included in the receiving device illustrated in FIG. 5 may also be achieved by a computer program.

Figure 6:
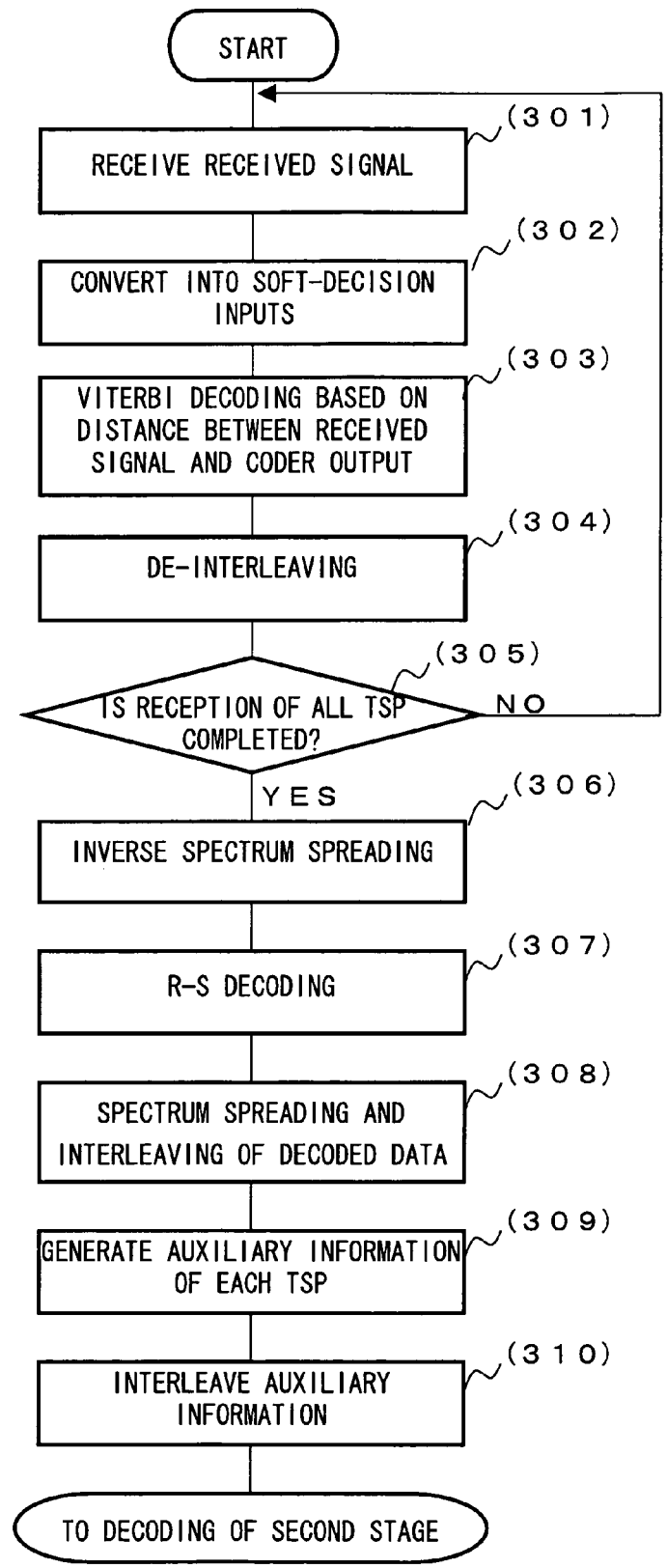
FIG. 6 is a flowchart representing error correct decoding of a first stage.
Figure 7:
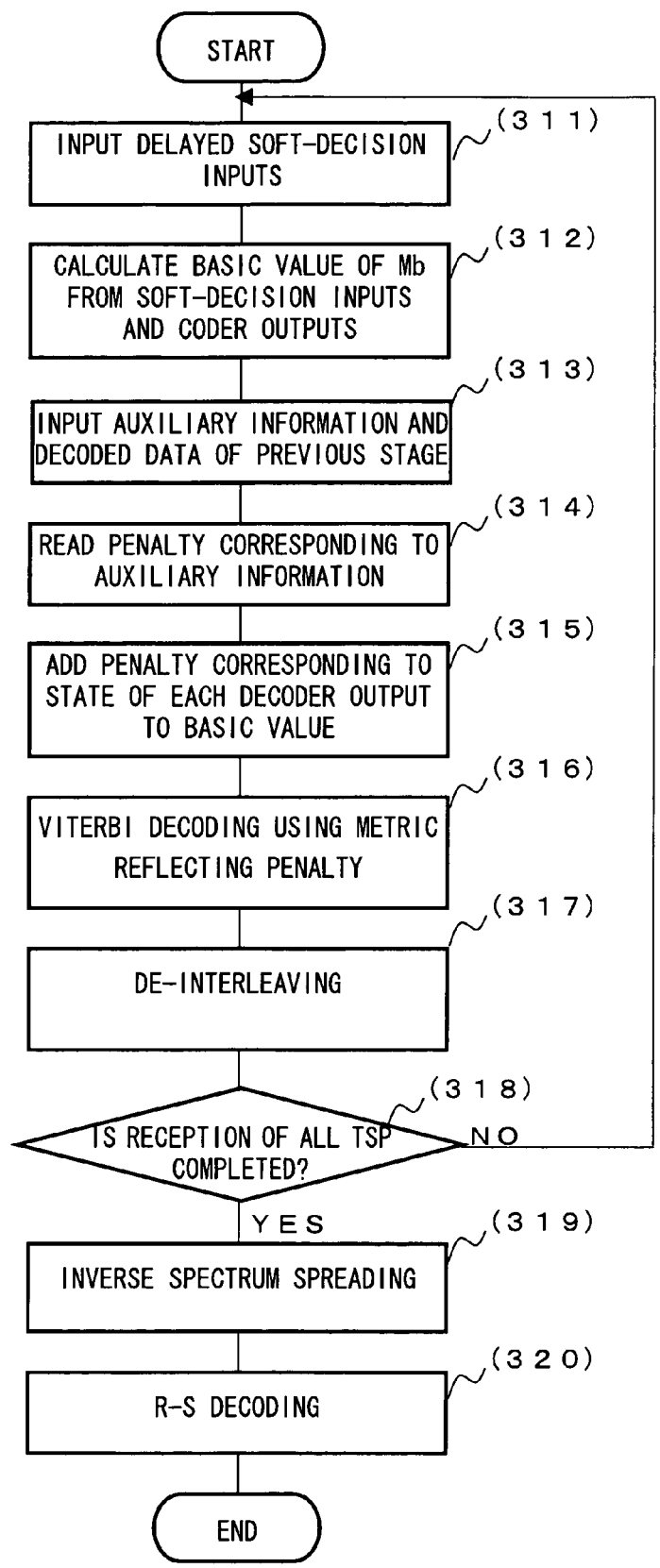
FIG. 7 is a flowchart representing error correct decoding of a second stage.

FIG. 6 illustrates a flowchart representing the error correct decoding of the first stage. Further, FIG. 7 illustrates a flowchart representing the error correct decoding of the second stage.

Through processing in steps 301 to 310 illustrated in FIG. 6, functions carried out by the error correct decoding part $200_1$, the soft decision generating part 107, the auxiliary information generating part 205, the interleavers 206, 208, and the spectrum spreading part 207 illustrated in FIG. 5 are exemplified.

Step 301 is a procedure to receive a received signal. Then this received signal is converted into soft-decision inputs in step 302, and Viterbi decoding is performed in step 303. In step 304, Viterbi decoding results are distributed to plural TSPs, and interleaving on the transmitting side is released. These processes are performed iteratively on received signals of all TSPs to be subjected to interleaving, and when distribution of decoding results of respective TSPs is completed, the flow proceeds to step 306, where an inverse spectrum spreading procedure is performed, through affirmative decision in step 305. Then, in step 307, R-S decoding is performed. In step 308, spectrum spreading and interleaving are applied to error corrected decoded data obtained in the R-S decoding. Thus, error corrected decoded data arranged corresponding to the received signal sequence can be obtained. On the other hand, based on the auxiliary information related to error correction obtained for respective TSPs during the R-S decoding, the auxiliary information corresponding to respective error corrected decoded data contained in these TSPs is generated in step 309. Then, in step 310, interleaving is applied to the generated auxiliary information, and thereby the auxiliary information arranged corresponding to the received signal sequence can be obtained.

Note, the processing in step 308 and the processing in steps 309, 310 may be performed in parallel, or performed in inverse order. The interleaved decoded data and auxiliary information obtained in the above-described steps 308, 310 are provided to decoding of the second stage illustrated in FIG. 7.

Through processing in steps 311 to 320 illustrated in FIG. 7, functions carried out by the error correct decoding part $200_2$, the input delaying part 213, the penalty calculating part 211, the table reading part 212, and the penalty reflecting part 106 illustrated in FIG. 7 are achieved.

Step 311 is a procedure to input delayed soft-decision inputs. In step 312, based on the soft-decision inputs and coder outputs of the state transition model, basic values equivalent to distances between the constellation points corresponding to outputs X, Y of the convolutional coder and the received signal points (Xc, Yc) are calculated. Further, in response to input of the soft-decision inputs corresponding to each received signal point, the corresponding error corrected decoded data and auxiliary information are input in step 313. Then, the penalties P0, P1 are read corresponding to the auxiliary information in step 314. And the read penalties P0, P1 are added to the above-described basic values according to the state of the output of the decoder (step 315). In this manner, a branch metric reflecting the error correction result in the previous stage may be obtained. This branch metric is used to perform Viterbi decoding in step 316. In step 317, similarly to step 304, Viterbi decoding results are distributed to plural TSPs, so as to release interleaving on the transmitting side. These processes are performed iteratively on the soft-decision inputs corresponding to received signals of all TSPs to be subjected to interleaving. When distribution of decoding results of respective TSPs is completed, it becomes affirmative decision in step 318. Accordingly, a procedure proceeds to step 319. In step 319, inverse spectrum spreading procedure is performed. Following to this, R-S decoding is performed (step 320). Error corrected decoded data obtained as results of the R-S decoding performed in this step 320 are output as conclusive decoded data obtained by iterative decoding.

Incidentally, in the Viterbi decoding, it is also possible to estimate the likelihood ratio of a received signal point based on significance of the correlation between the received signal point and the constellation point. Hereinafter, a method will be described for achieving the iterative decoding by using the significance of the correlation between the received signal point and the constellation point as an evaluation index.

(Embodiment 3)

Figure 8:
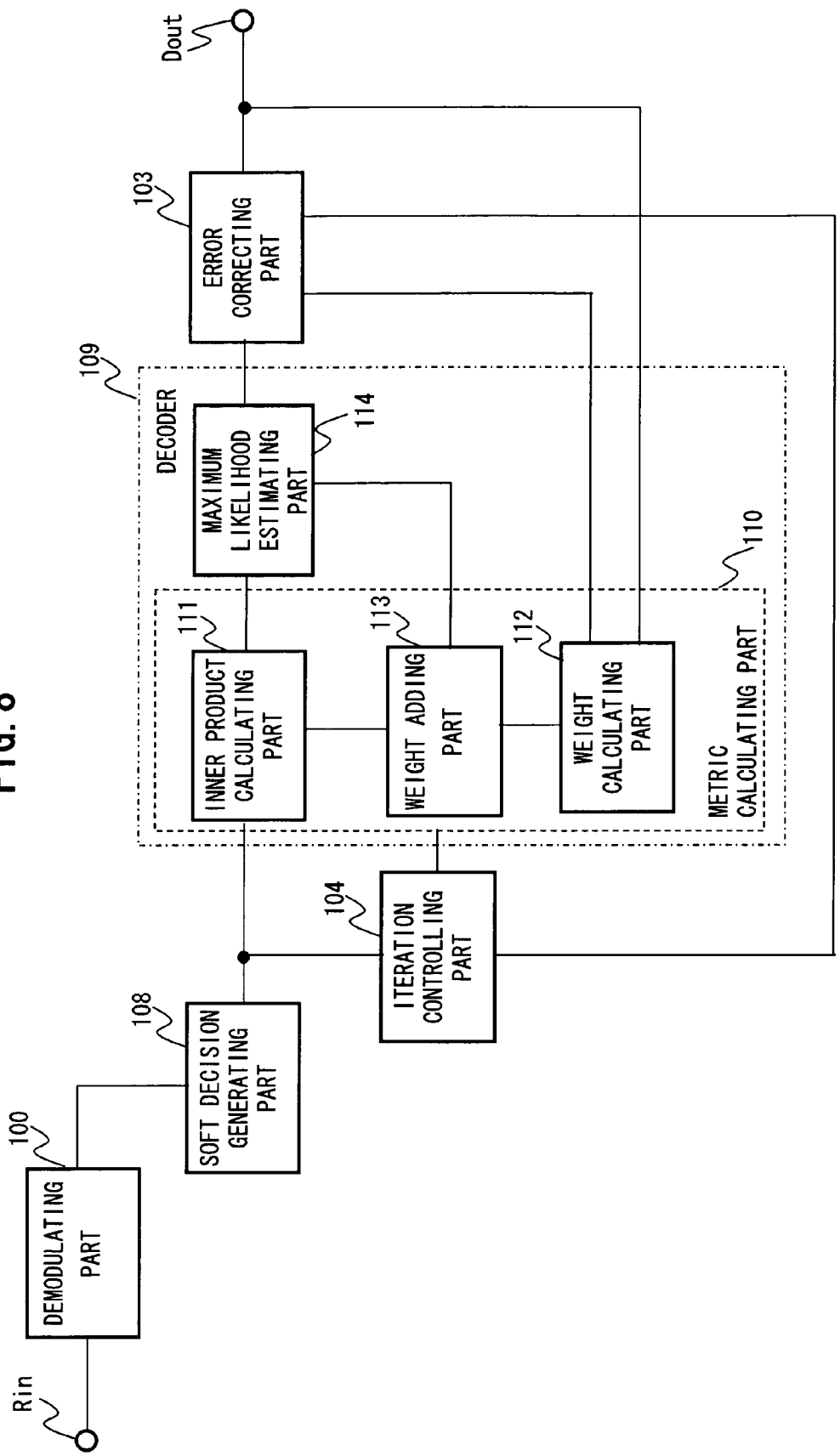
FIG. 8 is a diagram illustrating another embodiment of the receiving device.

FIG. 8 illustrates another embodiment of the receiving device. Note that among components illustrated in FIG. 8, ones equivalent to those illustrated in FIG. 1 are given the same reference numerals, and descriptions thereof are omitted.

The receiving device illustrated in FIG. 8 has a decoder 109 and a soft decision converting part 108 instead of the decoder 102 and the soft decision generating part 107.

The soft decision converting part 108 receives complex coordinates (i, q) indicating the position in a constellation of the signal point corresponding to each symbol of a demodulation signal from the demodulating part 100, and converts the complex coordinates into corresponding soft-decision inputs as will be described below.

Figure 9:
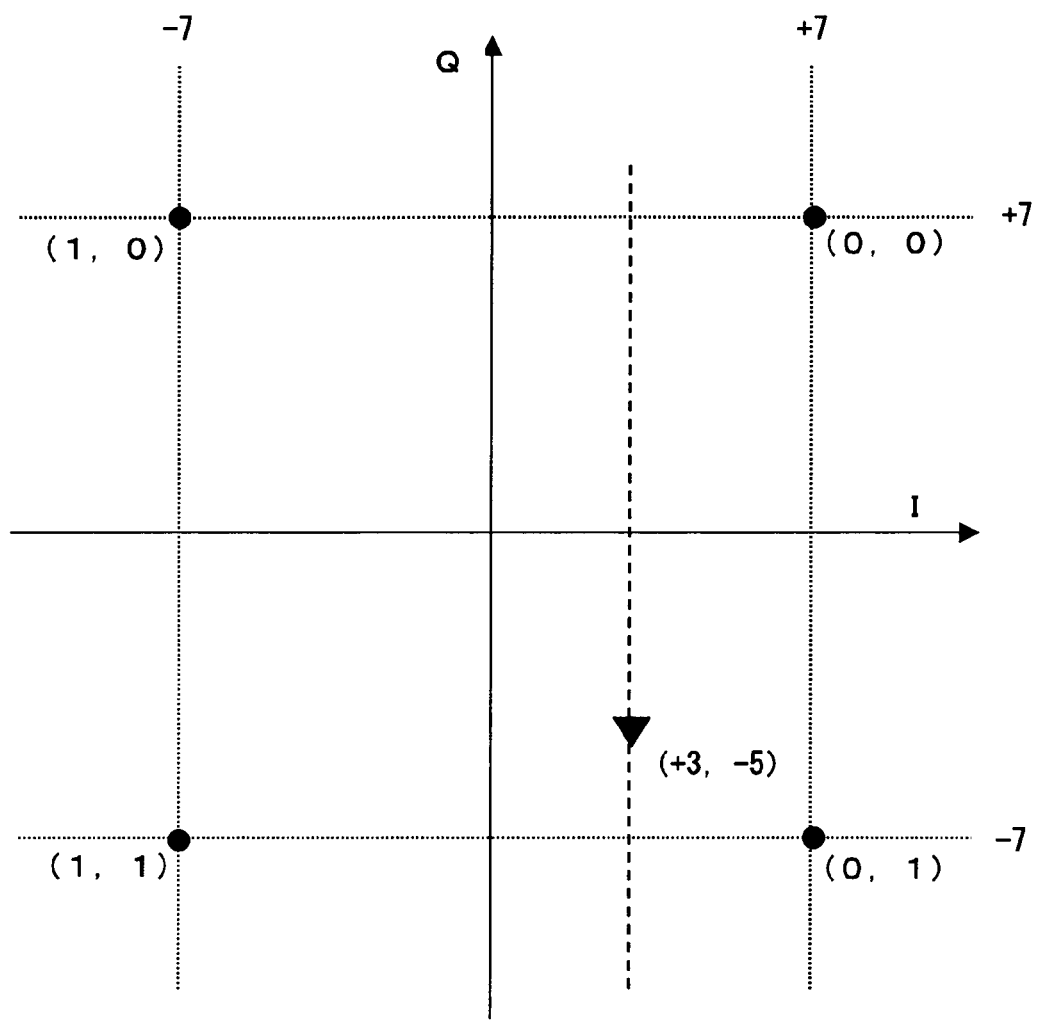
FIG. 9 is a diagram describing soft decision conversion.

FIG. 9 illustrates a diagram describing soft decision conversion. The example of FIG. 9 illustrates a constellation when QPSK (Quadratic Phase Shift Keying) is used as a modulating method. Further, in FIG. 9, four constellation points corresponding to two-bit information (b0, b1) in the QPSK modulation are illustrated with black dots and corresponding complex coordinate values.

The soft decision converting part 108 may digitize the coordinate of a signal point by using a predetermined unit length in the constellation. For example, the predetermined unit length is equivalent to the length which is obtained by dividing coordinate components indicated by a rectangle area with four constellation points illustrated in FIG. 9 being apexes by 7. In this manner, two soft-decision inputs (Xc, Yc) represented by one sign bit and three-bit numeric values can be generated from the complex coordinates (ic, qc) of a signal point C. In the example illustrated in FIG. 9, soft-decision inputs (3, −5) are generated corresponding to the signal point denoted by a triangle.

In addition, when any component of the coordinates of a signal point corresponding to a received signal is out of the range indicated by the above-described rectangle area, this component can be converted into a maximum or minimum soft-decision input corresponding to this component. In the example illustrated in FIG. 9, the I-axis coordinate corresponding to a signal point located on and outside the border of the rectangle area passing a constellation point (0, 0) and a constellation point (0, 1) is converted into a soft-decision input "+7" corresponding to information b0. On the other hand, the I-axis coordinate corresponding to a signal point located on and outside the border of the rectangle area passing a constellation point (1, 0) and a constellation point (1, 1) is converted into a soft-decision input "−7" corresponding to information b0. Similarly, the Q-axis coordinate corresponding to a signal point located on and outside the border of the rectangle area in the Q-axis direction is converted into soft-decision inputs "+7" and "−7" each corresponding to information b1. That is, hard decision outputs "0", "1" for the received signals are converted respectively into numeric values "$2^k-1$", "$-(2^k-1)$" represented using the bit length k used for representing soft-decision inputs.

Therefore, by the soft decision converting part 108, the received signal point is converted into soft-decision inputs such that the coordinate values corresponding to binary hard decision outputs become values whose positive and negative absolute values are maximum, respectively. With such soft-decision input, the height of reliability of the received signal point is indicated by the significance of the absolute value thereof. That is, when the received signal point is located near the constellation points, the absolute values of the corresponding soft-decision inputs become large, indicating that reliability of this received signal point is high. Conversely, the coordinate values of a received signal point distant from the constellation points are converted into soft-decision inputs close to a numeric value "0", indicating that reliability of this received signal point is low.

In the decoder 109 illustrated in FIG. 8, decoding as described below is performed based on correlation values of such soft-decision inputs and coder outputs in the state transition model. A metric calculating part 110 of the decoder 109 has an inner product calculating part 111, a weight calculating part 112, and a weight adding part 113. The inner product calculating part 111 performs processing to obtain an inner product of the input soft-decision inputs (Xc, Yc) and the coder outputs corresponding to each branch in the state transition model. At this time, the inner product calculating part 111 can use converted outputs (X, Y) indicating binary coder outputs in the state transition model for performing calculation of the inner product. These converted outputs (X, Y) can be obtained by, for example, converting into a value having a sign corresponding to the binary hard decision and having an absolute value equal to a maximum value among absolute values for above-described soft-decision inputs.

Figure 10:
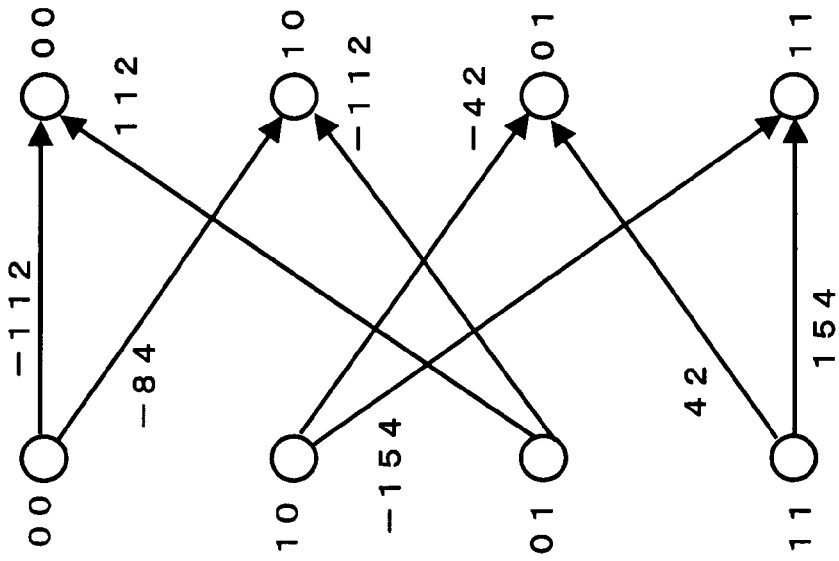
FIGS. 10A and 10B are diagrams describing calculation of a branch metric.
Figure 10:
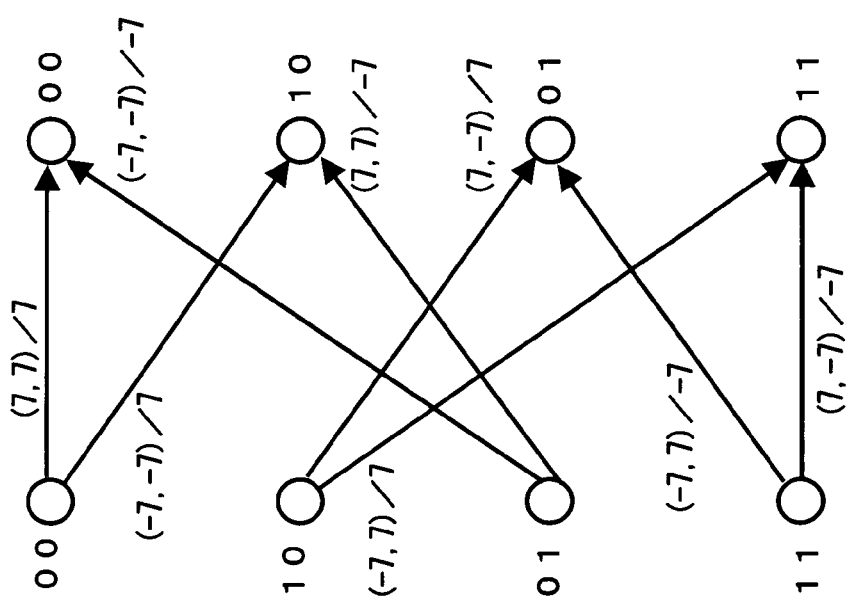

FIGS. 10A and 10B illustrate diagrams describing calculation of branch metrics. FIG. 10A is a trellis diagram representing state transitions of the convolutional coder with constraint length of 3. In the example of FIG. 10A, state transitions from one to another among four states (00), (10), (01), (11) of the coder are illustrated corresponding to a code combining the converted outputs (X, Y) obtained by converting the coder outputs corresponding to each branch with an input A. Note that in the example of FIG. 10A, the numeric values "0", "1" are illustrated as inputs "7", "−7" respectively after conversion, also for the input A.

For the branch indicated by the converted coder outputs (X, Y) in FIG. 10A, the inner product calculating part 111 may calculate the inner product P(X, Y) of the converted coder outputs (X, Y) and the input soft-decision inputs (Xc, Yc) as expressed by, for example, formula (2).

$$P(X,Y)=X \times Xc+Y \times Yc \quad (2)$$

The inner product P(X, Y) calculated thus for each branch indicates the significance of the correlation between the coder outputs and the received signal point which correspond to each branch. For example, when the converted coder outputs match the soft-decision inputs corresponding to the received signal, the corresponding inner product becomes a positive numeric value twice as large as the value resulted from squaring the maximum value of the soft-decision inputs. Conversely, when the converted coder outputs and the soft-decision inputs corresponding to the received signal are located at opposite positions across the origin of the complex coordinate system, the corresponding inner product becomes a negative numeric value twice as large as the value resulted from squaring the maximum value of the soft-decision inputs.

When the received signal sequence is converted for the first time by the decoder 109, the metric calculating part 110 illustrated in FIG. 8 may deliver the inner product P(X, Y) obtained in the above-described inner product calculating part 111 as the branch metric corresponding to each branch to a maximum likelihood estimating part 114. Then, by this maximum likelihood estimating part 114, processing to estimate the sequence of most likely decoded data is performed based on these branch metrics, and the error correction in the error correcting part 103 is performed on the obtained decoded data.

The weight calculating part 112 of the metric calculating part 110 illustrated in FIG. 8 calculates a weight G which increases the value of the branch metric of the branch which gives a likely decoding result based on the error corrected decoded data and the auxiliary information obtained in the error correcting part 103. The weight calculating part 112 may obtain the weight G represented as formula (3) using, for example, converted decoded data D' indicating binary error corrected decoded data. The value of the converted decoded data D' can be set to a value having the maximum absolute value of the above-described soft-decision inputs with sign corresponding to the binary error corrected decoded data.

$$G=W \times D' \times B \quad (3)$$

In the formula (3), the weight G is expressed as the product of the converted decoded data D', the predetermined coefficient W, and the auxiliary information B. In addition, the auxiliary information B represents success/failure of the error correction by numeric values "1", "0", respectively. And the weight calculating part 112 can set the value of the weight G to a numeric value "0" when the error correction is failed The weight G obtained corresponding to the error corrected decoded data and the auxiliary information in this manner is reflected on the branch metric as follows by the weight adding part 113. The weight adding part 113 may calculate based on formula (4) the branch metric Mb(X, Y, A) of each branch indicated by a combination of the converted coder outputs (X, Y) and the similarly converted input data A for example.

$$Mb(X,Y,A)=X \times Xc+Y \times Yc+A \times G \quad (4)$$

In the branch metric represented by the formula (4), the value indicating the correlation between the input data A and the decoded data D after error correction is added to the inner product calculated corresponding to each branch by the above-described inner product calculating part 111. In this manner, the previous decoding result may be reflected to the branch metrics being used for Viterbi decoding process in the next stage.

FIG. 10B illustrates a calculation example of a branch metric applied for performing iterative decoding when error correction based on decoding results obtained in the decoder 109 is succeeded in response to input of the received signal sequence including a received signal with which soft-decision inputs (3, −5) are obtained. In the example illustrated in FIG. 10B, it is assumed that the value of the converted decoded data D' for the error corrected decoded data corresponding to the above-described received signal is a numeric value "−7", and the value of the coefficient W in the formula (3) is a numeric value "2". In this case, the value of the weight G represented by the formula (3) becomes a numeric value "−14".

For example, in the trellis diagram illustrated in FIG. 10A, Mb(7, −7, −7) corresponding to a branch (7, −7)/−7 transiting from state (11) to state (11) can be calculated by substituting the soft-decision inputs (3, −5) and G=−14 in the formula (4) as indicated by formula (5).

$$Mb(7,-7,-7)=7 \times 3+(-7) \times (-5)+(-7) \times (-14)=154 \quad (5)$$

On the other hand, in the trellis diagram illustrated in FIG. 10A, Mb(−7, 7, 7) corresponding to a branch (−7, 7)/7 transiting from state (10) to state (11) can be calculated similarly as indicated by formula (6).

$$Mb(-7,7,7)=(-7) \times 3+7 \times (-5)+7 \times (-14)=-154 \quad (6)$$

In this manner, for each of state transitions represented in the trellis diagram, the branch metric can be obtained so as to give a large value to a likely branch, by reflecting the previous decoding result. Then, by subjecting the branch metric obtained thus to processing of the maximum likelihood estimating part 114, a more likely decoding result can be obtained.

By the above-described metric calculating part 110, as indicated by the formula (4), the previous decoding result is reflected on the branch metric being used for following decoding process by a simple arithmetic calculation. That is, in the receiving device exemplified in FIG. 8, the iterative decoding on concatenated codes containing the convolutional code can be achieved without increasing the circuit scale of the receiving circuit. By applying such a receiving device to, for example, a receiving device for digital terrestrial broadcasting, receiving characteristics thereof can be improved.

Next, an example of application to a receiving device of digital terrestrial broadcasting will be described.

(Embodiment 4)

Figure 11:
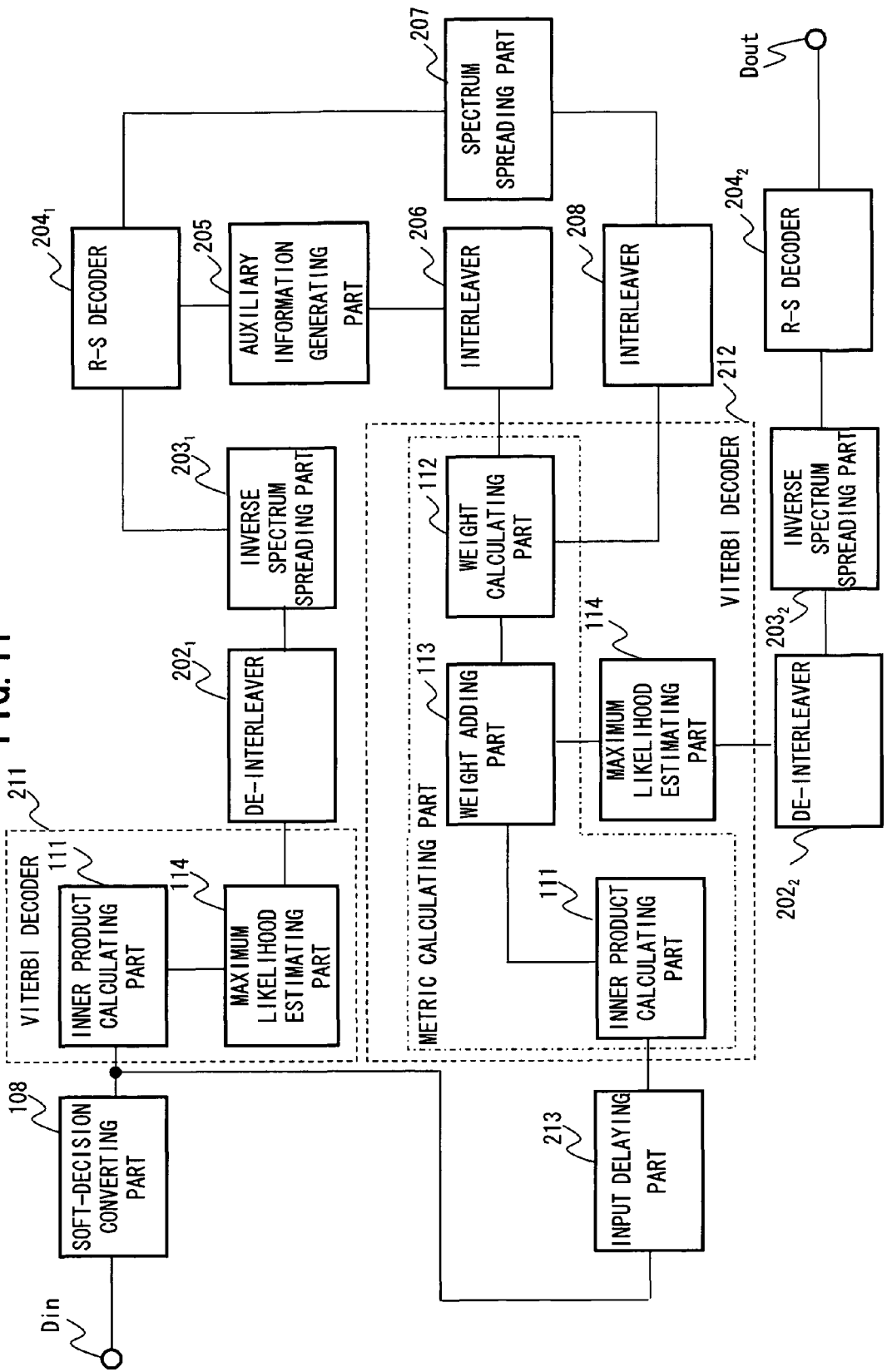
FIG. 11 is a diagram illustrating another embodiment of the receiving device.

FIG. 11 illustrates another embodiment of the receiving device. Note that among components illustrated in FIG. 11, ones equivalent to those illustrated in FIG. 5 and FIG. 8 are given the same reference numerals, and descriptions thereof are omitted.

An error correct decoding part of the first stage provided in the receiving device illustrated in FIG. 11 has a Viterbi decoder 211, a de-interleaver $202_1$, an inverse spectrum spreading part $203_1$, and an R-S decoder $204_1$. Further, an error correct decoding part of the second stage has a Viterbi decoder 212, a de-interleaver $202_2$, an inverse spectrum spreading part $203_2$, and an R-S decoder $204_2$.

To the Viterbi decoder 211 provided in the error correct decoding part of the first stage, soft-decision inputs obtained by the soft decision converting part 108 are input. In this Viterbi decoder 211, decoding results corresponding to a received signal sequence are obtained by the maximum likelihood estimating part 114 based on the branch metric indicating significance of the correlation between the soft-decision inputs calculated by the inner product calculating part 111 and each coded output in the state transition model. This decoding result is delivered to the R-S decoder 204a via the de-interleaver 202$_1$ and the inverse spectrum spreading part 203$_1$, where error correction in TSP units is performed. Error corrected decoded data in TSP units and auxiliary information which are obtained in the R-S decoder 204$_1$ are converted into a sequence of error corrected decoded data and auxiliary information corresponding to the received signal sequence by the spectrum spreading part 207 and the interleavers 206, 208, similarly to the above-described Embodiment 2.

To the Viterbi decoder 212 provided in the error correct decoding part of the second stage illustrated in FIG. 11, the above-described soft-decision inputs are input via the input delaying part 213. Further, every time the soft-decision inputs corresponding to each received signal are input from the input delaying part 213, corresponding auxiliary information and error corrected decoded data are input to the Viterbi decoder 212 according to the sequence re-ordered respectively by the above-described interleavers 206, 208.

The soft-decision inputs input to this Viterbi decoder 212 are provided to calculation of a correlation value with each coded output in the state transition model by the inner product calculating part 111, similarly to the Viterbi decoder 211. On the other hand, based on the auxiliary information and the error corrected decoded data input via the interleavers 206, 208, the weight to be applied to each branch is calculated according to the above-described formula (3) by the weight calculating part 112. The weight calculated by the weight calculating part 112 is added to the correlation value calculated corresponding to each branch by the inner product calculating part 111 according to the above-described formula (4) by the weight adding part 113. By this process, the above-described weight is reflected on the corresponding branch metric.

By providing the branch metric obtained in this manner to processing of the maximum likelihood estimating part 114, iterative decoding can be performed on the concatenated codes containing the convolutional code applied to a digital terrestrial broadcasting system.

In the receiving device illustrated in FIG. 11, the decoding result obtained by the error correct decoding part of the first stage is reflected by adding a weight which increases the likelihood ratio to the metric of a branch which gives a decoding result highly related to the error corrected decode data obtained from successful error correction in Viterbi decoding of the second stage.

In addition, it is possible to achieve the weight calculating part 112 and the weight adding part 113 with a small-scale logical operation circuit. Therefore, improvement in characteristics by iterative decoding can be achieved within the range of constraints of a circuit scale required in the receiving device for digital terrestrial broadcasting. Further, it is also possible to form a receiving device including three or more stages of error correct decoding parts.

Moreover, the functions of the respective parts included in the receiving device illustrated in FIG. 11 may also be achieved by a computer program.

Figure 12:
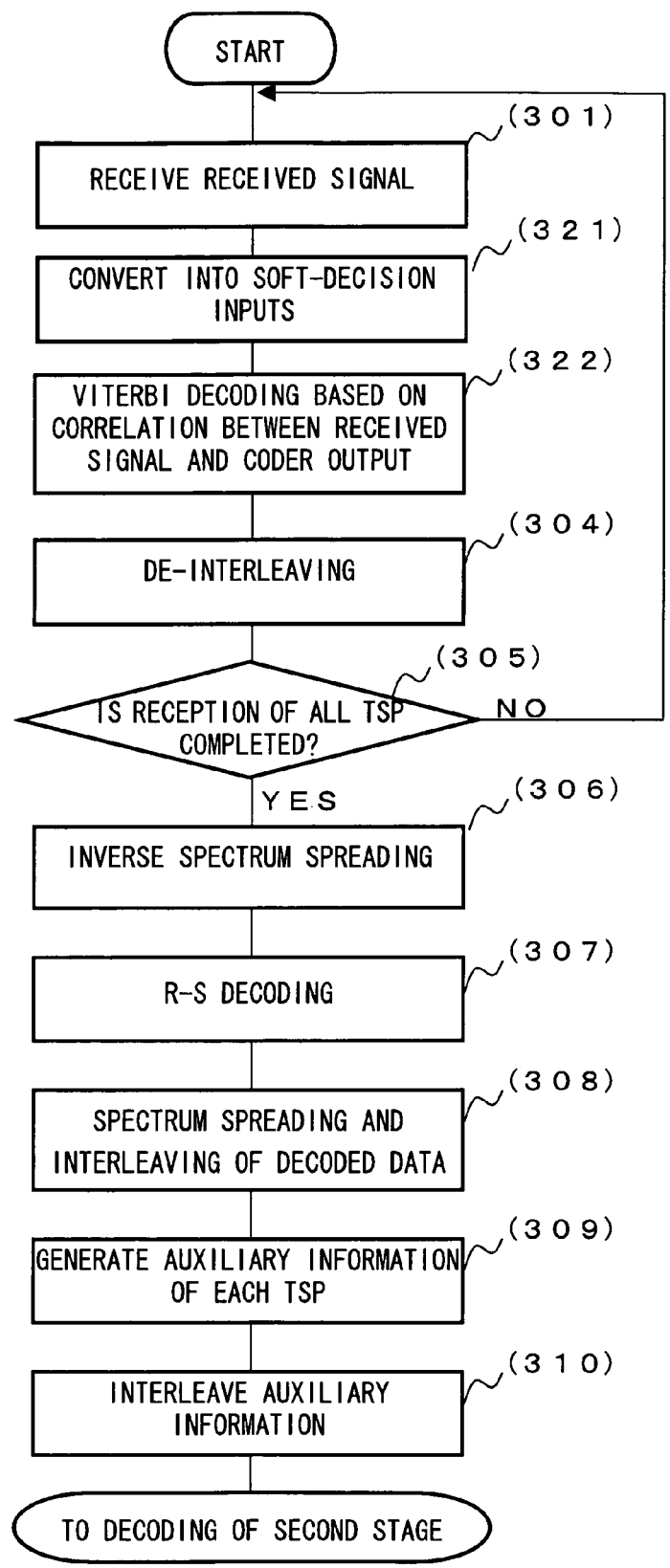
FIG. 12 is a flowchart representing error correct decoding of the first stage.
Figure 13:
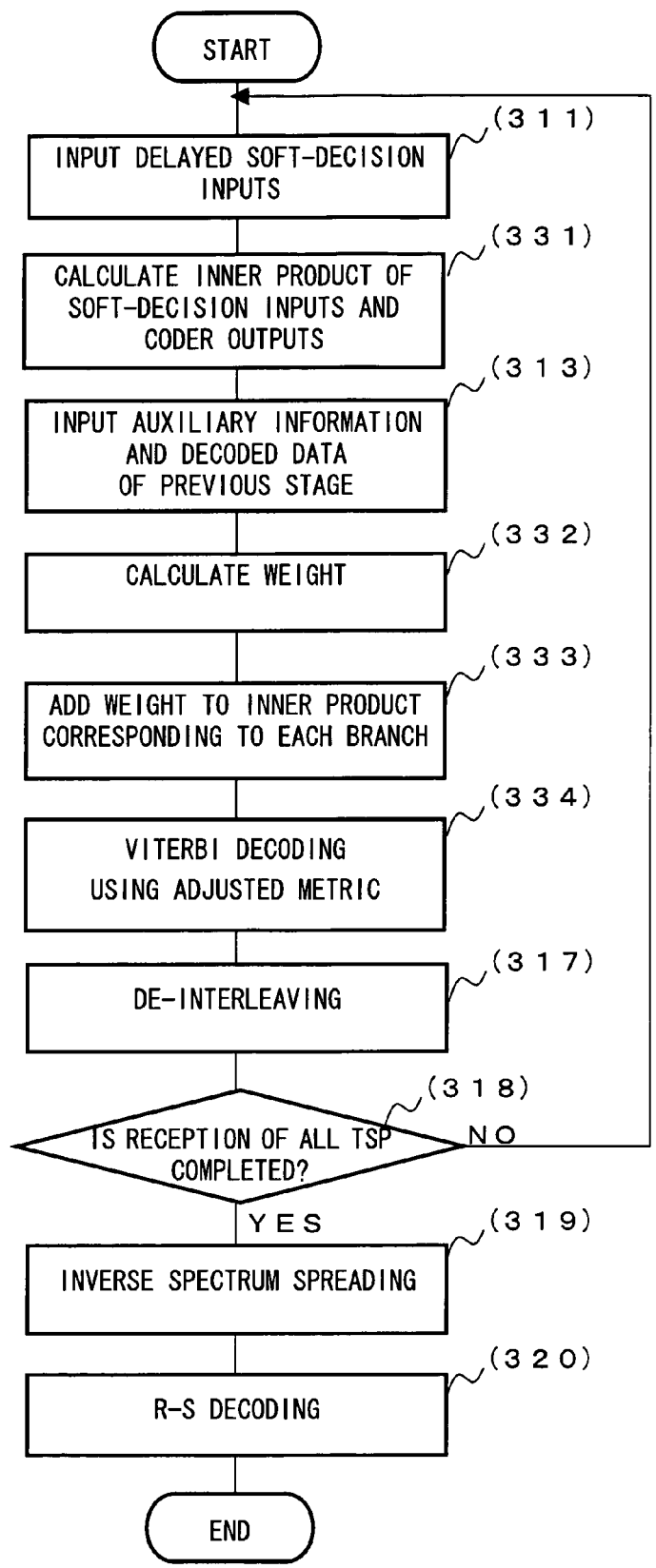
FIG. 13 is a flowchart representing error correct decoding of the second stage.

FIG. 12 illustrates a flowchart representing the error correct decoding of the first stage. Further, FIG. 13 illustrates a flowchart representing error correct decoding of the second stage. Among procedures illustrated in FIGS. 12 and 13, ones equivalent to the procedures illustrated in FIG. 6 and FIG. 7 are denoted by the same reference numerals, and descriptions thereof are omitted.

In the flowchart illustrated in FIG. 12, step 302 and step 303 of the flowchart illustrated in FIG. 6 are replaced with steps 321, 322, respectively.

Step 321 is a procedure to convert a received signal received in step 301 into soft-decision inputs as described using FIG. 9. Then, in step 322, there is performed Viterbi decoding in which the received signal points and constellation point are highly related or not is a criterion for evaluation. Processing from step 304 to step 310 thereafter is similar to the processing described in FIG. 6.

In the flowchart illustrated in FIG. 13, step 312 and step 314 to step 316 of the flowchart illustrated in FIG. 7 are replaced with step 331 and step 332 to step 334, respectively.

Step 331 is a procedure to calculate the inner product of the input soft-decision inputs and the coder outputs indicated on each branch of the trellis diagram illustrated in FIGS. 10A and 10B as a basic value of each branch metric. In step 332, the weight corresponding to the previous decoding result is obtained. This weight is represented by a product of converted decoded data and auxiliary information as the above-described formula (3). Furthermore, the converted decoded data is a numerical values "$2^k-1$" or "$-(2^k-1)$" according to the binary value of the hard decision input. Here, the number k is the bit length of the above-described soft-decision inputs, and auxiliary information represents success/failure of error correction by numeric values "1"/"0" (see the formula (3)). In step 333, there is performed processing to reflect the weight calculated in this manner on the metric of a branch, which gives decoding results highly related to the decode data obtained from successful error correction, so as to increase the likelihood ratio thereof. Specifically, as indicated by the formula (4), the product of value A obtained by converting the decoding results "0", "1" given by each branch into numerical values "$2^k-1$", "$-(2^k-1)$" respectively and the above-described weight is added to the basic value of the branch metric calculated in step 331. Thus, based on the branch metric on which the error correction result of the previous stage is reflected, Viterbi decoding is performed in step 334 in a manner that the size of the branch metric indicates height of the likelihood ratio. In Viterbi decoding in step 334, maximum likelihood estimation is performed based on the branch metric which a larger value indicates more closeness to a maximum likelihood. Processing from step 317 to step 320 thereafter is equivalent to the processing described in FIG. 7.

Note that the receiving device described from the above-described Embodiment 1 to Embodiment 4 are able to reflect an error correction result on decoding of a convolutional code in iterative decoding of concatenated codes containing the convolutional code, regardless of the constraint length of the convolutional coder. Therefore, the receiving device can be applied to a receiving device receiving a signal from a transmitting device using a convolutional coder with constraint length of 7 like those used for digital terrestrial broadcasting.

With the receiving device and receiving method disclosed herein, iterative decoding of concatenated codes containing a convolutional code can be achieved while suppressing increase in circuit scale.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A receiving device, comprising:
a soft decision generating part generating a sequence of soft-decision inputs represented by a predetermined number of bits from a received signal sequence;
a decoder performing decoding process corresponding to a convolutional code on the soft-decision inputs generated corresponding to the received signal sequence;
an error correcting part performing error correction on a decoding result sequence obtained by the decoder to generate an error corrected decoded data sequence containing error corrected decoded data corresponding to the received signal sequence;
an iteration controlling part causing the decoder and the error correcting part to iteratively perform first error correct decoding on the received signal sequence;
a penalty calculating part calculating, based on whether a success of the error correction is indicated or not by auxiliary information obtained from the error correcting part in second error correct decoding performed before the first error correct decoding, respective penalties for a branch transiting with a decoding result which matches the error corrected decoded data obtained in the error correcting part and a branch transiting with a decoding result which does not match the error corrected decoded data; and
a penalty reflecting part calculating a branch metric by reflecting the penalties on a basic value so as to decrease likelihood ratio of each of the branches, and inputting the branch metric being calculated to the decoder as a feedback value from the second error correct decoding, the basic value being equivalent to a distance between each received signal contained in the received signal sequence and coder outputs in a state transition model to which a coder corresponding to the decoder complies.

2. The receiving device according to claim 1, wherein the penalty calculating part comprises:
a first penalty setting part setting, when a decoding result obtained in the decoder in response to input of a received signal for which the success of the error correction is indicated by the auxiliary information does not match error corrected decoded data corresponding to the received signal, a predetermined first penalty to a branch transiting with the decoding result; and
a second penalty setting part setting, depending on whether decoding results obtained in the decoder in response to input of received signal for which failure of error correction is indicated by the auxiliary information match decoded data corresponding to the received signal or not, a second penalty and a third penalty which are smaller than the first penalty to each of branches transiting with the respective decoding results.

3. The receiving device according to claim 2, wherein the first penalty setting part sets a value obtained by multiplying a maximum value by a predetermined weight value as the first penalty, the maximum value being represented by the predetermined number of bits used for representing the soft-decision inputs.

4. The receiving device according to claim 3, wherein the second penalty setting part sets values of the second penalty and the third penalty based on a value obtained by multiplying a half value of the maximum value by the predetermined weight value.

5. The receiving device according to claim 4, wherein the second penalty setting part sets the second penalty to a branch transiting with a decoding result which does not match decoded data for which the failure of the error correction is indicated by the auxiliary information, in which the second penalty has a value larger than the third penalty.

6. A receiving method, comprising:
a decoding procedure using a decoder which performs decoding process corresponding to a convolutional code on a received signal sequence and an error correcting part performing error correction on a decoding result sequence obtained by the decoder to generate an error corrected decoded data sequence containing error corrected decoded data corresponding to the received signal sequence;
an iteration controlling procedure causing the decoder and the error correcting part to iteratively perform first error correct decoding on the received signal sequence;
a penalty calculating procedure calculating, based on whether a success of the error correction is indicated or not by auxiliary information obtained from the error correcting part in second error correct decoding performed before the first error correct decoding, respective penalties for a branch transiting with a decoding result which matches the error corrected decoded data obtained in the error correcting part and a branch transiting with a decoding result which does not match the error corrected decoded data; and
a penalty reflecting procedure calculating a branch metric by reflecting the penalties on a basic value so as to decrease likelihood ratio of each of the branches, and inputting the branch metric being calculated to the decoder as a feedback value from the second error correct decoding, the basic value being equivalent to a distance between each received signal contained in the received signal sequence and coder outputs in a state transition model to which a coder corresponding to the decoder complies.

7. A receiving device, comprising:
a soft decision converting part converting each of components of coordinates of signal points corresponding to respective symbols included in an input received signal sequence into a sequence of soft-decision inputs represented by a predetermined number of bits in order for each of coordinate values corresponding to binary hard decision outputs to be converted to a value having a sign corresponding to the binary hard decision and having an absolute value equal to a maximum value among absolute values for conversion results;
a decoder performing decoding process corresponding to decoding of a convolutional code on the sequence of soft-decision inputs obtained by the soft decision converting part;
an error correcting part performing error correction on a decoding result sequence obtained by the decoder to generate an error corrected decoded data sequence containing error corrected decoded data corresponding to the received signal sequence; and
an iteration controlling part causing the decoder and the error correcting part to iteratively perform first error correct decoding on the received signal sequence, wherein the decoder comprises a metric calculating part calculating, based on a correlation value of each of the soft-decision inputs input to the decoder and coder outputs in a state transition model to which a coder corresponding to the decoder complies, a branch metric which a larger value indicates more closeness to a maximum likelihood, and providing the branch metric being calculated to maximum likelihood estimation in the decoder; and the metric calculating part comprises:

a weight calculating part obtaining, when error correct decoding is performed iteratively by the decoder and the error correcting part, a weight reflecting auxiliary information corresponding to each of the soft-decision inputs input to the decoder based on the auxiliary information and error corrected decoded data obtained from the error correcting part in a process of second error correct decoding performed before the first error correct decoding; and a weight adding part adding the weight calculated by the weight calculating part to the branch metric obtained for each of corresponding soft-decision inputs.

8. The receiving device according to claim 7, wherein:

the metric calculating part includes an inner product calculating part obtaining correlation value of the soft-decision inputs and the coder outputs in the state transition model as an inner product of a vector indicated by soft-decision inputs corresponding to coordinates of each of signal points input to the decoder and a vector indicated by a soft-decision input corresponding to the coder outputs in the state transition model;

the weight calculating part calculates the weight as a product of soft-decision inputs corresponding to each error corrected decoded data included in the error corrected decoded data sequence generated by the error correcting part, auxiliary information representing whether error correction is succeeded or not by one of a numeric value 1 and numeric value 0, respectively, and a predetermined gain parameter; and the weight adding part reflects the weight by adding a product a value corresponding to a decoding result obtained by the decoder in response to the soft-decision inputs corresponding to each of the signal points and the weight obtained in the weight calculating part to the branch metric calculated based on the correlation value calculated in the inner product calculating part.

* * * * *

UNITED STATES PATENT AND TRADEMARK OFFICE
CERTIFICATE OF CORRECTION

PATENT NO. : 8,375,279 B2
APPLICATION NO. : 12/929927
DATED : February 12, 2013
INVENTOR(S) : Mitsuru Tomono et al.

It is certified that error appears in the above-identified patent and that said Letters Patent is hereby corrected as shown below:

Title Page, under (30) Foreign Application Priority Data; insert -- Mar. 26, 2010 (JP) Foreign Application Ser. No. 2010-072308 --, therefor.

Signed and Sealed this
Fourteenth Day of May, 2013

Teresa Stanek Rea
*Acting Director of the United States Patent and Trademark Office*